(12) United States Patent  
Yamaguchi et al.

(10) Patent No.: US 7,265,401 B2  
(45) Date of Patent: Sep. 4, 2007

(54) SEMICONDUCTOR DEVICE HAVING HIGH DIELECTRIC CONSTANT GATE INSULATING LAYER AND ITS MANUFACTURE METHOD

(75) Inventors: Masaomi Yamaguchi, Kawasaki (JP); Hiroshi Minakata, Kawasaki (JP); Tsunehisa Sakoda, Kawasaki (JP); Kazuto Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/148,317

(22) Filed: Jun. 9, 2005

(65) Prior Publication Data

US 2006/0172498 A1  Aug. 3, 2006

(30) Foreign Application Priority Data

Jan. 28, 2005  (JP) .............................. 2005-021029

(51) Int. Cl.  
*H01L 29/94* (2006.01)

(52) U.S. Cl. ...................... 257/288; 257/410; 257/411; 257/E21.001

(58) Field of Classification Search ................ 257/411, 257/410, 406, 288, 344; 245/408  
See application file for complete search history.

(56) References Cited

U.S. PATENT DOCUMENTS 6,784,114 B1 *  8/2004  Tao et al. .................... 438/769

6,809,370 B1 * 10/2004  Colombo et al. ............ 257/310  
2006/0094259 A1 *  5/2006  Gilmer et al. ............... 438/785

FOREIGN PATENT DOCUMENTS

| JP | 11-163276 | 6/1999 |
|---|---|---|
| JP | 2001-77111 | 3/2001 |
| JP | 2001-274378 | 10/2001 |
| JP | 2002-359370 | 12/2002 |
| JP | 2003-8011 | 1/2003 |
| JP | 2003-23005 | 1/2003 |

* cited by examiner

*Primary Examiner*—Michael Trinh  
(74) *Attorney, Agent, or Firm*—Westerman, Hattori, Daniels & Adrian, LLP.

(57) ABSTRACT

A semiconductor device manufacture method has the steps of: (a) forming an interface layer of SiO or SiON on the surface of an active region of a silicon substrate; (b) forming a high dielectric constant gate insulating film such as HfSiON having a dielectric constant higher than that of silicon oxide, above the interface layer; (c) forming a gate electrode of polysilicon above the high dielectric constant gate insulating film; (d) passivating the substrate surface at least before or after the high dielectric constant gate insulating film is formed; (e) forming an insulated gate electrode structure by patterning at least the gate electrode and the high dielectric constant gate insulating film; and (f) forming source/drain regions in the active region on both sides of the insulated gate electrode structure. The semiconductor device has the high dielectric constant insulating film having a dielectric constant higher than that of silicon oxide.

7 Claims, 5 Drawing Sheets

SEMICONDUCTOR DEVICE HAVING HIGH DIELECTRIC CONSTANT GATE INSULATING LAYER AND ITS MANUFACTURE METHOD

CROSS REFERENCE TO RELATED APPLICATION

This application is based on and claims priority of Japanese Patent Application No. 2005-021029 filed on Jan. 28, 2005, the entire contents of which are incorporated herein by reference.

BACKGROUND OF THE INVENTION

A) Field of the Invention

The present invention relates to a semiconductor device and its manufacture method, and more particularly to a semiconductor device having a high dielectric constant gate insulating film and its manufacture method.

B) Description of the Related Art

Insulated gate (IG) type field effect transistors (FET), typically MOS transistors, are widely used as representative semiconductor elements of a semiconductor integrated circuit device. In order to achieve high integration of semiconductor integrated circuit devices, IG-FETs have been miniaturized in accordance with scaling rules. Miniaturization such as thinning a gate insulating film and shortening a gate length reduces each size of IG-FET and can improve the performance of IG-FET while maintaining the performance of each miniaturized element normally.

MOS transistors of the next generation are required to set the gate length to sub 100 nm and thin the gate oxide film to 2 nm or thinner. At this thickness, tunnelling current starts to flow directly so that gate leak current increases and a consumption power increases. There is a limit in miniaturization so long as silicon oxide is used as the material of the gate insulating film. In order to suppress tunneling current flowing through the gate insulating film, it is desired to use a thick gate insulating film.

It has been proposed to use insulating material having a dielectric constant higher than that of silicon oxide as the material of a gate insulating film, in order to increase a physical film thickness while an equivalent oxide film thickness (EOT) is set to 2 nm or thinner. It is said that a relative dielectric constant of silicon oxide is about 3.5 to 4.5 (e.g., 3.9) although it depends on a film forming method. Silicon nitride has a dielectric constant higher than that of silicon oxide and it is said that silicon nitride has a relative dielectric constant of about 7 to 8 (e.g., 7.5).

Japanese Patent Laid-open Publication No. 2001-274378 proposes to use: as the material of a gate insulating film, materials having a dielectric constant higher than that of silicon oxide such as: barium titanic acid ($Ba(Sr)TiO_3$) having a relative dielectric constant of 200 to 300; titanium oxide ($TiO_2$) having a relative dielectric constant of about 60; tantalum oxide ($Ta_2O_5$), zirconium oxide ($ZrO_2$), and hafnium oxide ($HfO_2$) having a relative dielectric constant of about 25; silicon nitride ($Si_3N_4$) having a relative dielectric constant of about 7.5; and alumina ($Al_2O_3$) having a relative dielectric constant of about 7.8. It also proposes the structure that a silicon oxide film is interposed between a high dielectric constant insulating material film of the above-described materials and a silicon substrate.

In this specification, compounds are expressed in some cases in the form of HfO, HfSiON, SiO and the like. These expressions are intended to have not only a chemical stoichiometric composition but also a composition shifted from the chemical stoichiometric composition.

Adopting new materials having a high dielectric constant as the material of a gate insulating film of IG-FET poses a new problem. Namely, zirconium oxide and hafnium oxide are crystallized by a high temperature process so that leak current increases through electric conduction via crystal grain boundaries and defect levels. It is desired to solve this new problem in order to promote practical usage of new materials.

Japanese Patent Laid-open Publication No. 2001-77111 proposes to hinder the formation of crystalline structures and maintain an amorphous phase by adding aluminum oxide to zirconium oxide and hafnium oxide.

Japanese Patent Laid-open Publication No. 2003-8011 proposes to improve thermal stability by adding silicon oxide to hafnium oxide.

Japanese Patent Laid-open Publication No. 2003-23005 indicates that if a high dielectric constant material (high-k material) layer made of metal oxide is formed on a silicon substrate, a silicon oxide layer is formed at the interface between the metal oxide film and silicon substrate, and proposes to flow hydrogen in place of oxygen before the metal oxide film is formed.

Japanese Patent Laid-open Publication No. 2002-359370 proposes to form a nitrogen atom layer on both surfaces of a high dielectric constant gate insulating film in order to suppress impurity diffusion from the gate electrode into a silicon substrate and diffusion of metal elements and oxygen from the gate insulating film into the gate electrode or silicon substrate.

An oxynitride film having Hf as its main composition has a relative dielectric constant several to about ten times higher than that of silicon oxide. It is an urgent issue to develop an oxynitride film capable of being used as the material of a gate insulating film of the sub 100 nm node generation. Polysilicon is anticipated to be used as the material of the gate electrode, and the insulated gate electrode structure is expected to be a structure of polysilicon/high-k insulating film/SiO(N)/silicon substrate.

SUMMARY OF THE INVENTION

An object of the present invention is to provide a semiconductor device having a gate insulating film made of insulating material having a dielectric constant higher than that of silicon oxide.

Another object of the present invention is to provide a semiconductor device manufacture method capable of using, as the material of a gate insulating film, insulating material having a dielectric constant higher than that of silicon oxide.

Still another object of the present invention is to provide a semiconductor device having a gate insulating film made of high dielectric constant oxide material with a reduced shift in flat band voltage.

Another object of the present invention is to provide a semiconductor device manufacture method capable of using, as the material of a gate insulating film, high dielectric constant oxide material with a reduced shift in flat band voltage.

According to one aspect of the present invention, there is provided a semiconductor device comprising:

a silicon substrate;

an active region defined in a surface layer of the silicon substrate;

an insulated gate electrode formed on an intermediate area of the active region; and source/drain regions formed in the active region on both sides of the insulated gate electrode, wherein the insulated gate electrode comprises an interface layer on the active region, a high dielectric constant gate insulating film having a dielectric constant higher than a dielectric constant of silicon oxide and formed above the interface layer, and a gate electrode formed above the gate insulating film, and at least one of an interface between the gate insulating film and the interface layer and an interface between the gate insulating film and the gate electrode is passivated.

According to another aspect of the present invention, there is provided a semiconductor device manufacture method comprising the steps of:

(a) forming an interface layer on a surface of an active region of a silicon substrate;

(b) forming a high dielectric constant gate insulating film having a dielectric constant higher than a dielectric constant of silicon oxide, above the interface layer;

(c) forming a gate electrode above the gate insulating film;

(d) passivating a surface of the silicon substrate at least before or after the step (b) of forming the high dielectric constant gate insulating film;

(e) forming an insulated gate electrode structure by patterning at least the gate electrode and the high dielectric constant gate insulating film; and (f) forming source/drain regions in the active region on both sides of the insulated gate electrode structure.

An interface between a high dielectric constant gate insulating film and an adjacent layer is subjected to the passivation process so that it is possible to suppress an unintended reaction at the interface or near at the interface.

DESCRIPTION OF THE PREFERRED EMBODIMENTS

An SiO film or an SiON film is formed on the surface of the channel region of a MOS transistor in order to make the silicon substrate surface chemically and electrically stable. These films have a function of stabilizing the interface between the substrate and an upper layer and are called an interface layer.

In the structure of polysilicon/high-k (HfO) insulating film/SiO(N) interface layer/silicon substrate, it has been found that an interface reaction, Hf—Si coupling and the like occur at the interface between the high-k insulating film and the SiO(N) interface layer and at the interface between polysilicon and the high-k insulating film. Because of these phenomena, it is very difficult to form an electrically good interface, and it has been observed that fixed charges are generated on the channel side and Fermi pinning (pinning Fermi level) phenomenon is induced on the gate electrode side. There are therefore adverse effects on the electric characteristics such as an increase in a threshold value Vth of a MOS type field effect transistor (FET). A shift in the threshold value may be ascribed to a shift ΔVfb in flat band voltage Vfb.

In order to suppress the occurrence of the interface reaction and Hf-Si coupling at the interface between the high-k insulating film and the SiO(N) interface layer and at the interface between polysilicon and the high-k insulating film, it is conceivable that these interfaces are to be subjected to passivation. The present inventors have considered to make these interfaces be subjected to passivation using sulfur (S) not adversely affecting silicon.

With reference to FIGS. 1A to 1I, description will be made on the processes of forming samples used by the experiments made by the present inventors.

Figure 1A:
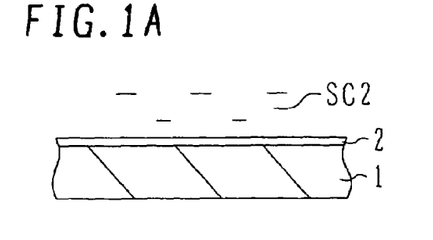
FIGS. 1A to 1I are cross sectional views and a plan view explaining the experiments made by the present inventors.

As shown in FIG. 1A, a natural oxide film on the surface of a p-type silicon substrate 1 having (10 0) plane as its principal surface was removed by dilute hydrofluoric acid and thereafter the substrate was washed with SC2 cleaning liquid to form a silicon oxide (chemical oxide) film having a thickness of about 1 nm on the silicon surface.

Figure 1B:
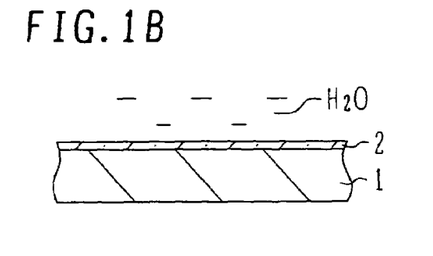

As shown in FIG. 1B, the silicon substrate was washed in flowing pure water for 10 minutes to improve an osmotic pressure for a later S process.

Figure 1C:
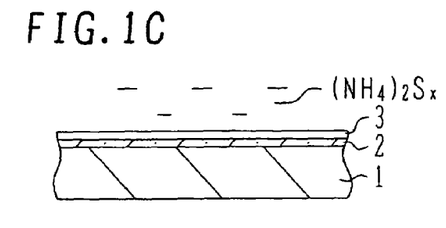

As shown in FIG. 1C the substrate was immersed for one minute in ammonium sulfide $(NH_4)_2S_x$ aqueous solution maintained at 70° C. to conduct an S process. With this S process, the substrate surface became pure white, which may be considered that an S film 3 was formed. For a comparative sample, the substrate was immersed for one minute in ammonium sulfide $(NH_4)_2S_x$ aqueous solution maintained at 50° C. to conduct the S process. The ammonium sulfide aqueous solution is pure ammonium water containing ammonium at 28 wt % and S at 6.0 wt % to 7.5 wt %.

Figure 1D:
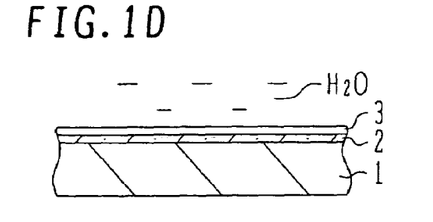

As shown in FIG. 1D, after the S process, the substrate was washed in flowing pure water for one minute in order to flow out unnecessary ammonium sulfide. The silicon substrate surface maintained pure white.

Figure 1E:
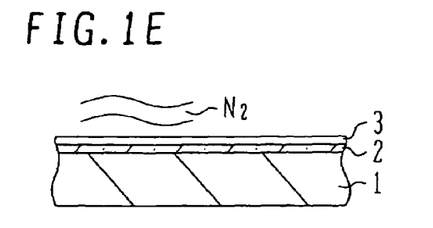

As shown in FIG. 1E, the substrate surface was dried by hot nitrogen at 200° C. to 300° C. Although a fair amount of S was attached initially to the substrate surface and the substrate surface was pure white, as the hot nitrogen drying process progressed, the substrate surface recovered silicon color, which is considered that the unnecessary S was sublimated. Although the S film 3 has almost a negligible thickness, in the drawing figures, it is shown having a thickness for drawing conveniences. At this stage, a sample not subjected to the S process was also prepared.

Figure 1F:
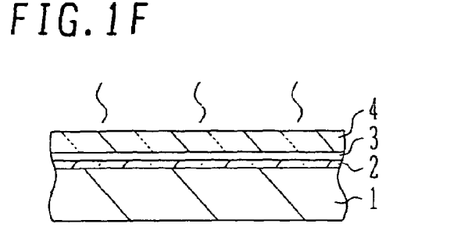

As shown in FIG. 1F, a $(Hf_{0.75}Si_{0.25})(O_{0.90}N_{0.10})$ high dielectric constant gate insulating film 4 was deposited to a thickness of about 4 nm by chemical vapor deposition (CVD) in a sufficiently oxidized state, by using a source gas of $Hf(N(CH_3)_2)_4$, $SiH(N(CH_3)_2)_3$ and NO gasses and an $N_2$ gas as a carrier gas, at a substrate temperature of 600° C.

Figure 1G:
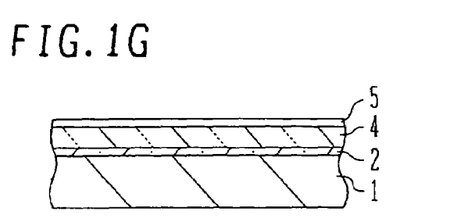

As shown in FIG. 1G, an S film 5 was formed on the surface of a high dielectric gate insulating film 4 not subjected to the S process before the high dielectric constant gate insulating film is formed, by executing the processes shown in FIGS. 1B to 1E. Similar to the S film 3, the S film 5 after the hot nitrogen drying had almost a negligible thickness. Prepared as measurement samples were a sample subjected to the S process before the high dielectric constant gate insulating film is formed and a sample subjected to the S process after the high dielectric constant gate insulating film is formed.

Figure 1H:
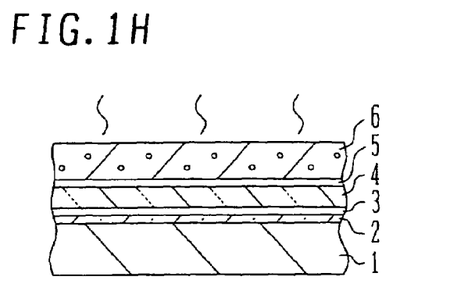

As shown in FIG. 1H, a polysilicon layer 6 having a thickness of about 100 nm was deposited on the silicon substrate surface by chemical vapor deposition (CVD) at a substrate temperature of 600° C. There is only one of the S passivation process films 3 and 5.

Figure 1I:
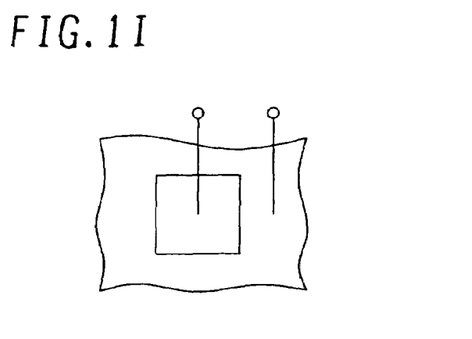

As shown in FIG. 11, the polysilicon layer 6 was patterned to form an electrode of 80 μm×80 μm. C-V measurement were performed by using this MOS capacitor electrode.

Whether S passivation was formed or not by the S process was measured through Auger electron spectroscopy.

Figure 2A:
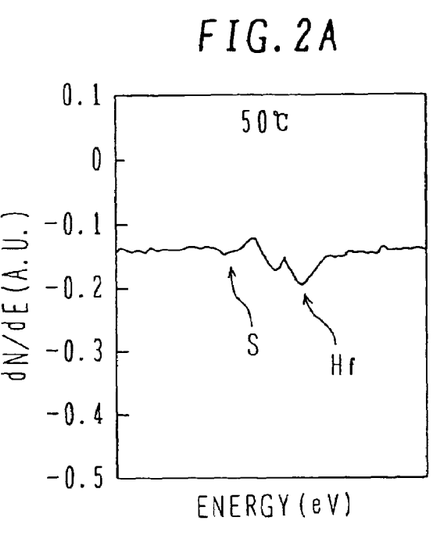
FIGS. 2A to 2C are spectrum diagrams and a graph showing the measurement results of samples.

FIG. 2A is a spectrum graph of a comparison sample processed by ammonium sulfide aqueous solution at 50° C. Although a peak of Hf can be observed, a peak of S cannot be observed.

Figure 2B:
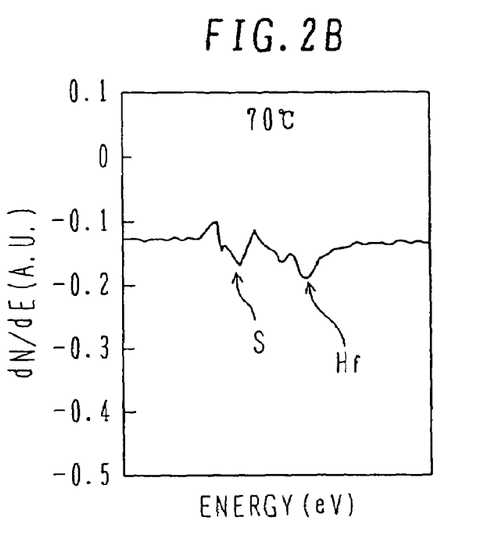

FIG. 2B is a spectrum graph of a comparison sample processed by ammonium sulfide aqueous solution at 70° C. A peak of S as well as a peak of Hf can be observed clearly. S exists definitely even by the passivation having almost a negligible thickness. It is expected the S process by ammonium sulfide aqueous solution is effective at 60° C. or higher.

It was difficult to form proper S passivation by ammonium sulfide aqueous solution having an S density of 2 wt % to 3 wt %. It is expected that the S density of ammonium sulfide aqueous solution is preferable 5 wt % or higher. The S process is not limited only to ammonium sulfide aqueous solution, but ammonium sulfide gas or hydrogen sulfide gas may also be used.

Figure 2C:
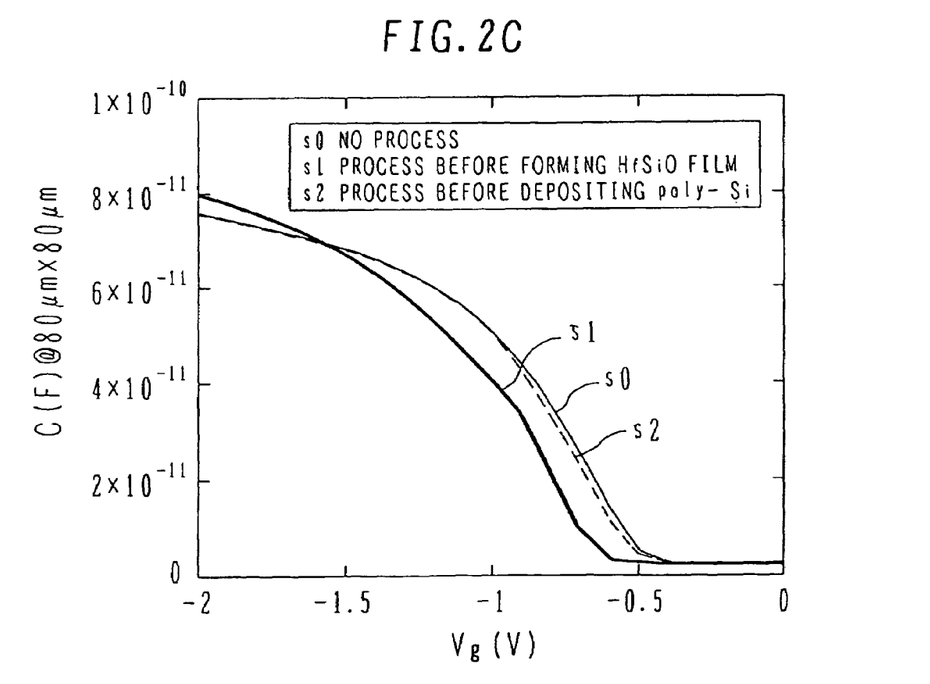

FIG. 2C shows the C-V characteristics measured by using MOS capacitors. A curve s0 indicates the characteristics of the sample not subjected to the S process, a curve s1 indicates the characteristics of the sample subjected to the S process before the high dielectric constant gate insulating film is formed, and a curve s2 indicates the characteristics of the sample subjected to the S process after the high dielectric constant gate insulating film is formed.

The ideal value of flat band voltage expected from the material performance is about 0.9 V, a shift ΔVfb in the flat band voltage of about 500 mV can be observed for the sample not subjected to the S process. The flat band voltage shift ΔVfb is improved by about 200 mV for the sample subjected to the S process before the high dielectric constant gate insulating film is formed. This can be considered that fixed charges at the interface are reduced. A slight improvement on the flat band voltage shift can be observed even for the sample subjected to the S process after the high dielectric constant gate insulating film is formed. This can be considered that the generation of Hf—Si couplings at the interface is suppressed.

Although the SiO film is formed as the underlying layer of the high dielectric constant insulating film, similar results are expected if an SiON film is used in place of the SiO film. The material of the high dielectric constant insulating film is not limited to HfSiON, but it may be material containing at least one of Hf, Al, Zr, Ta, Ti and Y. Passivation is not limited to S, but Se and Te may be used. If the material not containing Si is used as the material of the gate electrode, the generation of Hf-Si couplings will not occur and the S process after the high dielectric insulating film is formed is expected to be effective if the gate electrode contains Si.

Next, description will be made on a semiconductor device manufacture method and a manufactured semiconductor device.

Figure 3A:
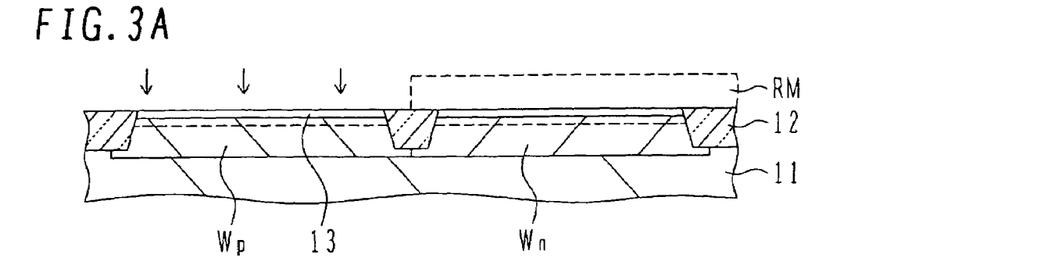
FIGS. 3A to 3H are cross sectional views illustrating the processes of a semiconductor device manufacture method according to an embodiment.

As shown in FIG. 3A, an element isolation region 12 is formed by shallow trench isolation (STI) on a p-type silicon substrate 11 having a (1 0 0) principal surface, and a through oxide film 13 is formed on the surface of an active region. By using resist masks RM, p-type impurity ions are implanted into an n-channel MOS transistor (n-MOS) region, and n-type impurity ions are implanted into a p-channel MOS transistor (p-MOS) region to form a p-type well Wp and an n-type well Wn. For example, p-type impurity ions B are implanted at an acceleration voltage of 360 kV and a dose of 1×10$^{13}$ cm$^{-2}$ (hereinafter abbreviated to 1E13, for example), and n-type impurity ions As are implanted at an acceleration voltage of 360 kV and a dose of 1E13.

Figure 3B:
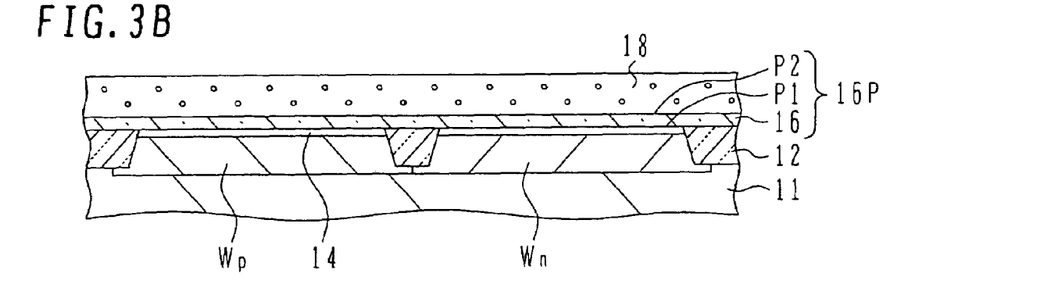

As shown in FIG. 3B, the through oxide film 13 is removed by dilute hydrofluoric acid, and a silicon oxide film having a thickness of about 1 nm is formed through SC2 washing, and an SiON interface layer 14 is formed through heat treatment in an nitridizing atmosphere. A passivation P1 is formed on the interface layer 14 by executing the S process shown in FIGS. 1B to 1E. It is not necessary that passivation P1 and P2 have a thickness but they may be diffused in upper and lower layers. The gate insulating films 16 having the passivation P1 and P2 are expressed by 16P.

A $(Hf_{0.75}Si_{0.25})(O_{0.90}N_{0.10})$ high dielectric constant gate insulating film 4 is deposited to a thickness of about 4 nm by CVD using a source gas of $Hf(N(CH_3)_2)_4$, $SiH(N(CH_3)_2)_3$ and NO gasses and an $N_2$ gas as a carrier gas, at a substrate temperature of 600° C. The S process such as shown in FIGS. 1A to 1E is again executed to form a passivation P2. Thereafter, a polysilicon gate electrode layer 18 having a thickness of 100 nm is deposited by CVD at a substrate temperature of 600° C.

Figure 3C:
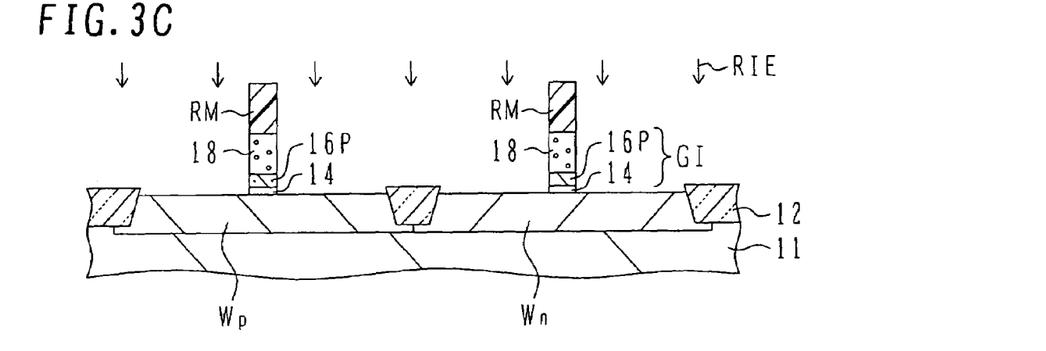

As shown in FIG. 3C, a resist mask RM is formed on the gate electrode layer 18, and the gate electrode layer 18, gate insulating film 16P and interface layer 14 are patterned by reactive ion etching (RIE). A gate length Lg is set to, for example, 22 nm. RIE etching gas is, for example, $Cl_2$ or $BCl_3$. The gate insulating film 16P and interface layer 14 are collectively called a gate insulating layer GI, where appropriate. The interface layer 14 may not be patterned at this stage. The resist mask RM is thereafter removed.

Figure 3D:
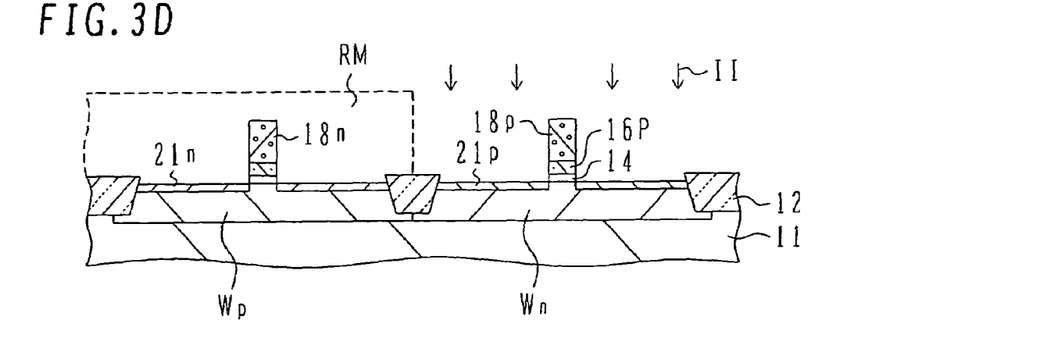

As shown in FIG. 3D, by using resist masks RM separating the n-MOS region and p-MOS region, n-type impurity ions As are implanted into the n-MOS region at an acceleration voltage of 3 kV and a dose of 1E15, and p-type impurity ions $BF_2$ are implanted into the p-MOS region at an acceleration voltage of 3 kV and a dose of 1E15, to form extension regions 21n and 21p. Impurities are doped also into the gate electrodes 18 which are changed to an n-type gate electrodes 18n and a p-type gate electrode 18p.

Figure 3E:
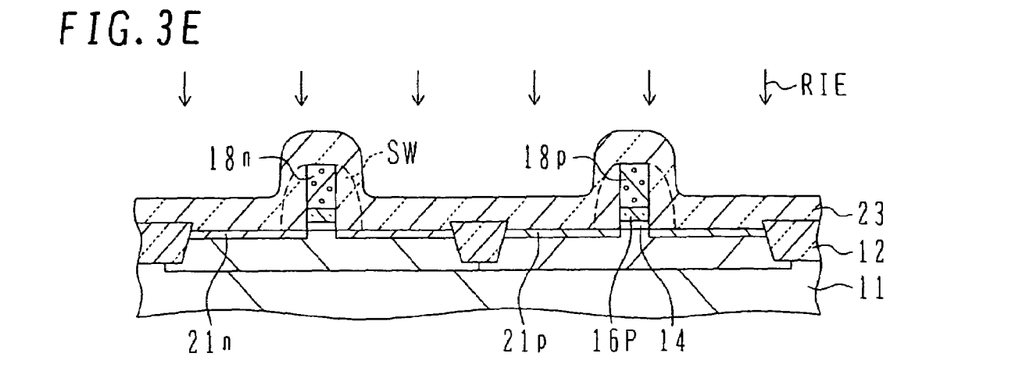

As shown in FIG. 3E, an SiO film 23 is deposited on the whole substrate surface by CVD to a thickness of 30 nm, and RIE is executed by using $CHF_3+O_2+Ar$ as etching gas, to leave side wall spacers on the side walls of the gate electrodes.

Figure 3F:
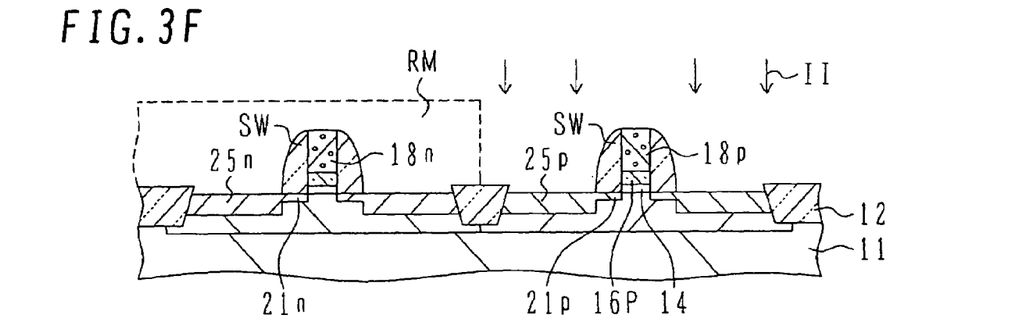

As shown in FIG. 3F, by using resist masks RM separating the n-MOS region and p-MOS region, n-type impurity ions P are implanted into the n-MOS region at an acceleration voltage of 50 kV and a dose of 4E15, and p-type impurity ions B are implanted into the p-MOS region at an acceleration voltage of 50 kV and a dose of 4E15, to form high concentration source/drain regions 25n and 25p in outer areas of the side wall spacers SW. Impurities are also doped in the gate electrodes 18.

Figure 3G:
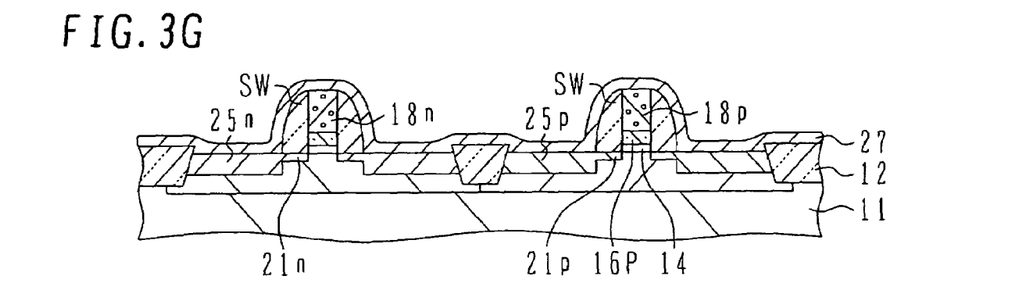

As shown in FIG. 3G, a cobalt film 27 having a thickness of 5 nm is deposited by sputtering and annealed for about 30 seconds at 450° C. to 550° C. to conduct a primary silicidation reaction. An unreacted cobalt film 27 on the insulating film and the like is removed by acid washing or the like.

Figure 3H:
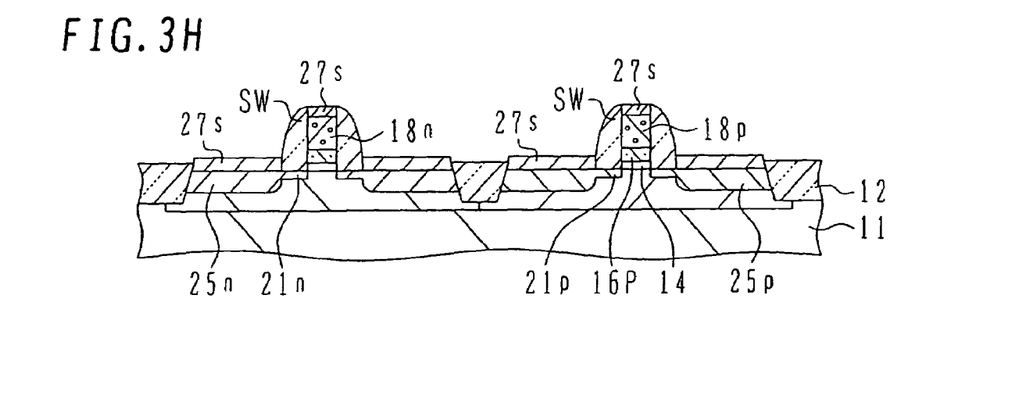

As shown in FIG. 3H, annealing is performed for about 30 seconds at 650° C. to 750° C. to conduct a secondary silicidation reaction to form sufficiently low resistance silicide 27s on the gate electrodes 18n and 18p and source/drain regions 25n and 25p. With these processes, a CMOS structure is formed.

Figure 4:
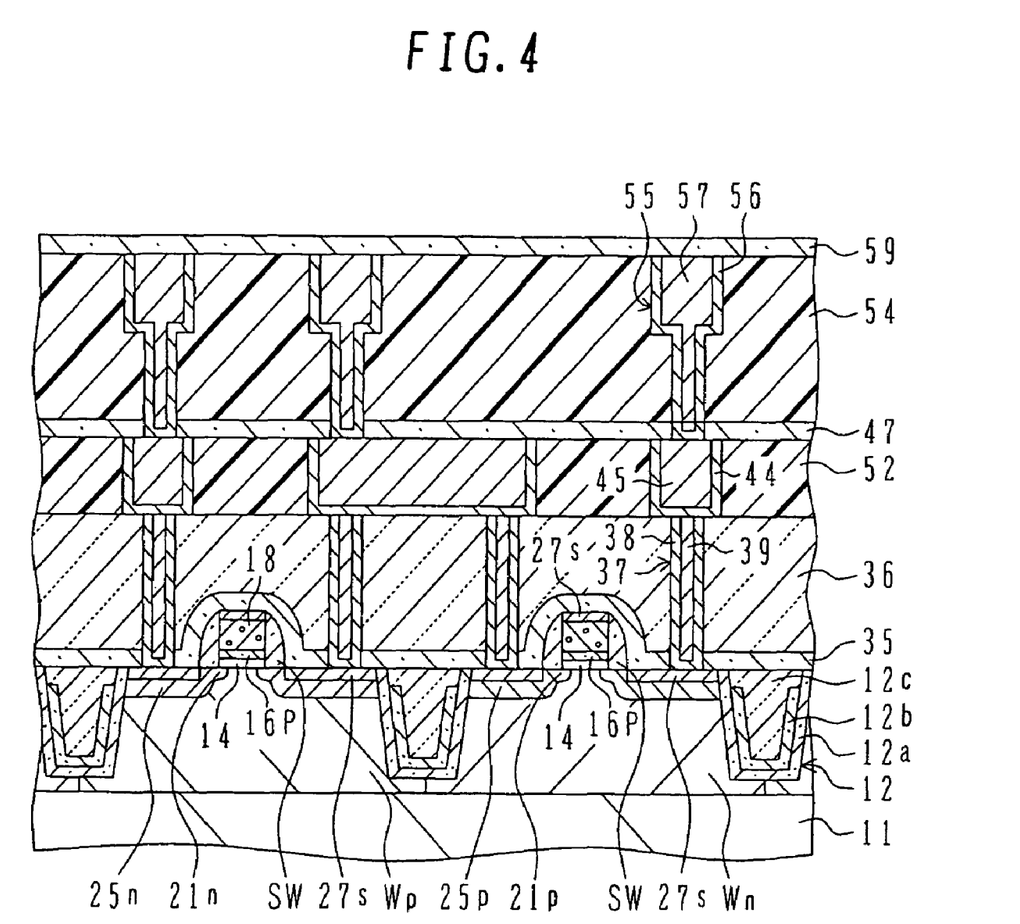
FIG. 4 is a cross sectional view showing the structure of a semiconductor device.

FIG. 4 shows the structure of a semiconductor device having multilayer wirings. Shallow trenches 12 are formed in the surface layer of a silicon substrate 11. For example, a silicon oxide layer having a thickness of 9 to 21 nm, e.g., 10 nm, is formed on the surface of the silicon substrate 11 by thermal oxidation. On the silicon oxide layer, a silicon nitride layer having a thickness of 100 to 150 nm, e.g., 110 nm, is formed by low pressure (LP) chemical vapor deposition (CVD). For example, LPCVD is executed at a temperature of 750° C. to 800° C. by using $SiCl_2H_2$ and $NH_3$ as source gas. Since the nitride layer is relatively thick, the film forming speed is increased by setting the film forming temperature higher.

A resist pattern covering the active region (element forming region) is formed on the silicon nitride layer. Openings of the resist pattern define the element isolation region. For example, a width of the opening is 0.1 to 1 μm. By using the resist pattern as an etching mask, the silicon nitride layer and silicon oxide layer are etched. The resist mask may be removed at this stage. By using the etched silicon nitride layer as an etching mask; the silicon substrate 11 is anisotropically etched by reactive ion etching (RIE). For example, the silicon substrate 11 is etched to a depth of 300 nm to form trenches. Etching the silicon nitride layer and silicon oxide layer is executed by using a mixture gas of $CF_4$, $CHF_3$ and Ar as etching gas. Etching the silicon substrate 11 is executed by using a mixture gas of HBr and $O_2$ or a mixture gas of $Cl_2$ and $O_2$ as etching gas.

The silicon substrate surface exposed on the trench surface is thermally oxidized to form a silicon oxide liner 12a having a thickness of, for example, 3 nm. The whole silicon surface exposed in the trench is covered with the silicon oxide liner 12a. A silicon nitride liner 12b having therein a tensile stress is formed by LPCVD. Although the thicker the silicon nitride liner 12b, the stronger the tensile stress, if it is too thick, the opening becomes narrow so that even a high density plasma (HDP) silicon oxide film is difficult to be buried. For example, a thickness of the silicon nitride liner 12b is set to 20 nm. LPCVD is executed by using a mixture gas of $SiCl_2H_2$ and $NH_3$ as source gas at a temperature lower than 680° C., e.g., about 650° C. Since the silicon nitride liner is relatively thin, a relatively low film forming temperature is set to lower a film forming speed. The source gas may be silane ($SiH_4$), ammonium ($NH_3$), tetrachlorsilane ($SiCL_4$) and ammonium, bis-tertial-butylaminosilane (BT-BAS) and ammonia, and the like. The formed silicon nitride liner has a tensile stress of 1.2 GPa or larger. This stress has an opposite direction to that of a stress in a buried silicon oxide layer subjected to heat treatment for making the film dense. After the SiN liner is formed, heat treatment at 1000° C. to 1150° C. may be performed by rapid thermal annealing (RTA) or the like. For example, heat treatment is performed for 30 seconds at 1000° C. in an $N_2$ atmosphere so that the tensile stress in the SiN layer can be increased by 20 to 30%.

Organic material having the composition equivalent to the resist is filled in the trench, and the upper portion thereof is removed to expose the upper surface of the silicon nitride liner which is selectively removed. The substrate formed with the silicon nitride liner 12b is subjected to a pre-annealing for 1 to 5 minutes at 400° C. to 450° C. in a chamber of a high density plasma (HDP) CVD system, and in succession, in the same chamber a silicon oxide layer 12c is formed by HDPCVD and buried in the trench. For example, if a trench having a depth of 300 nm is formed, a thickness of the buried silicon oxide layer 12c is about 500 nm in the flat area.

Forming the silicon oxide layer 12c is performed by using as a source gas a mixture gas of $SiH_4$ and oxygen or a mixture gas of TEOS and ozone. After the silicon oxide layer 12c is grown, annealing is performed at about 1000° C. to make dense the silicon oxide layer 12c. The quality of the silicon oxide layer 12c in the trench after the annealing is generally the same as that of the thermal oxide layer. Although the dense silicon oxide layer has a compression stress, this stress is cancelled out by the tensile stress of the silicon nitride liner having the opposite stress direction. An electron mobility to be lowered by the compression stress can be mitigated.

An unnecessary insulating layer on the surface of the silicon substrate is removed by chemical mechanical polishing (CMP) to form a STI 12. The silicon nitride layer on the substrate surface functions as a polishing stopper. Instead of CMP, RIE using a mixture gas of $CF_4$ and $CHF_3$ may be used. The silicon nitride layer used as the stopper is etched by hot phosphoric acid. Thereafter, the silicon oxide layer on the surface of the silicon substrate 11 is removed by dilute hydrofluoric acid.

Thereafter, the processes described with reference to FIGS. 3A to 3H are executed to form wells Wp and Wn, an interface layer 14, a gate insulating film 16P having passivation, gate electrodes 18n and 18p, extensions 21n and 21p, side wall spacers SW, source/drain regions 25n and 25p and silicide layer 27s to form a CMOS structure.

Well-known various structures may be used as the CMOS transistor structure. For the structure of a general semiconductor device and its manufacture processes, for example, refer to U.S. Pat. No. 6,707,156.

A contact etch stopper layer 35 of silicon nitride is deposited on the silicon substrate, covering the CMOS transistor structure. This silicon nitride layer is formed, for example, by thermal CVD under the following conditions. A silicon nitride layer having a quality suitable for being formed on a silicon substrate surface as a contact etch stopper is formed by using Centura manufactured by the Applied Materials, Inc. as a thermal CVD system, under the conditions of a pressure of 300 torr and a temperature of 600° C. by flowing $N_2$ at 5000 sccm, $NH_3$ at 7000 sccm and $Si_2H_6$ at 19 sccm.

A phosphosilicate glass (PSG) layer 36 as a low level interlayer insulating film is formed on the contact etch stopper layer 35, for example, by thermal CVD. Contact holes 37 are opened through the low level interlayer insulating film 36 and contact etch stopper layer 35, a barrier layer 38 of TiN or the like is deposited, a W layer is buried, and an unnecessary portion is removed to form conductive plugs.

On the low level interlayer insulating layer 36, an organic insulating layer 52 of polyallyl ether is deposited to a thickness of 130 nm, wiring pattern trench are formed, and copper wirings of a barrier layer 44 and a copper layer 45 are buried in the trenches. On the organic insulating layer 52 of polyallyl ether buried with the copper wirings, an SiC layer 47 having a thickness of 50 nm is formed by PE-CVD. On the SiC layer 47, an organic insulating layer 54 of polyallyl ether as an interlayer insulating film is deposited to a thickness of 250 nm. Dual damascene wiring trenches 55 are formed in the organic insulating layer 54 of polyallyl ether, a barrier layer 56 and a copper layer 57 are buried in the trenches to form dual damascene copper wirings. On the dual damascene wirings, an SiC layer 59 having a thickness of 50 nm is formed by PE-CVD. If necessary, an interlayer insulating layer forming process and a wiring layer forming process are repeated.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
a silicon substrate;
an active region defined in a surface layer of said silicon substrate;
an insulated gate electrode formed on an intermediate area of said active region; and
source/drain regions formed in said active region on both sides of said insulated gate electrode,
wherein said insulated gate electrode comprises an interface layer on said active region, a high dielectric constant gate insulating film having a dielectric constant higher than a dielectric constant of silicon oxide and formed above said interface layer, and a gate electrode formed above said gate insulating film, and at least one of an interface between said gate insulating film and said interface layer and an interface between said gate insulating film and said gate electrode is passivated by existence of at least one of S, Se and Te on a whole area near said interface.

2. The semiconductor device according to claim 1, wherein said interface layer contains at least one of SiO and SiON.

3. The semiconductor device according to claim 2, wherein said high dielectric constant gate insulating film contains at least one of Hf, Al, Zr, Ta, Ti and Y.

4. The semiconductor device according to claim 1, wherein said gate electrode contains Si, and said interface between said gate insulating film and said gate electrode is passivated.

5. The semiconductor device according to claim 1, wherein said interface between said gate insulating film and said interface layer is S- passivated, and said high dielectric constant gate insulating film is made of HfSiON.

6. The semiconductor device according to claim 5, wherein said interface between said gate insulating film and said gate electrode is passivated, and said gate electrode includes a polysilicon layer.

7. The semiconductor device according to claim 1, wherein a passivated film is of substantially negligible thickness.

* * * * *